United States Patent [19]
Edwards, Jr. et al.

[11] Patent Number: 5,155,368
[45] Date of Patent: Oct. 13, 1992

[54] ION BEAM BLANKING APPARATUS AND METHOD

[75] Inventors: David Edwards, Jr., Hamilton; Billy W. Ward, Rockport, both of Mass.

[73] Assignee: Micrion Corporation, Peabody, Mass.

[21] Appl. No.: 686,043

[22] Filed: Apr. 16, 1991

[51] Int. Cl.$^5$ .................. H01J 37/147; H01J 37/30
[52] U.S. Cl. .................. 250/396 R; 250/398; 250/492.2
[58] Field of Search ............ 250/396 R, 397, 398, 250/492.21, 491.1

[56] References Cited

U.S. PATENT DOCUMENTS

| | | | |
|---|---|---|---|
| 3,993,509 | 11/1976 | McGinty | 250/492.21 |
| 4,084,095 | 4/1978 | Wolfe | 250/398 |
| 4,423,305 | 12/1983 | Pfeiffer | 250/491.1 |
| 4,439,685 | 3/1984 | Plies | 250/398 |
| 4,503,329 | 3/1985 | Yamaguchi et al. | 250/309 |
| 4,649,316 | 3/1987 | Cleaver et al. | 313/361.1 |
| 4,661,702 | 4/1987 | Welkie | 250/309 |
| 4,820,928 | 4/1989 | Ooyama et al. | 250/492.2 |

FOREIGN PATENT DOCUMENTS

| | | |
|---|---|---|
| 59-116600 | 7/1984 | Japan . |
| 60-89051 | 5/1985 | Japan . |
| 60-74249 | 4/1986 | Japan . |
| 62-103950 | 5/1987 | Japan . |
| 62-177849 | 8/1987 | Japan . |
| 62-229645 | 10/1987 | Japan . |
| 64-89254 | 4/1989 | Japan . |
| 1-176082 | 7/1989 | Japan . |

OTHER PUBLICATIONS

G. Ryding, "Target Chambers for Ion Implantation," 1981, *Nuclear Inst. and Methods*, vol. 189, No. 1, pp. 274–290.

Primary Examiner—Bruce C. Anderson
Attorney, Agent, or Firm—Lahive & Cockfield

[57] ABSTRACT

Ion beam apparatus provides beam blanking by utilizing an aperture through which the beam passes during unblanked periods, and elements for deflecting the beam during blanking so that the beam is deflected away from the aperture. Electrodes between the aperture element and the deflecting elements generate a potential exceeding the kinetic energy of charged particles emitted from the aperture element due to ions striking the aperture element during blanking. Charged particles emitted from the aperture element are thus prevented from striking the beam deflecting elements, thereby reducing hydrocarbon cracking, insulator accumulation, and charge accumulation on the deflecting elements. Beam stability is thereby enhanced. Charged particles emitted from the aperture element are also returned to the aperture element, so that an accurate measure of ion beam current is obtained by measuring current flow to the aperture element.

9 Claims, 4 Drawing Sheets

ION BEAM BLANKING APPARATUS AND METHOD

BACKGROUND OF THE INVENTION

This invention relates generally to ion beam apparatus, and, more particularly, relates to apparatus and methods for selectively deflecting and blanking an ion beam.

Ion beam devices employed for mask repair and other applications typically include elements for blanking the ion beam when the ion beam is not to impinge on the workpiece. Examples of such configurations are discussed in the following U.S. Pat. Nos.:

| | |
| --- | --- |
| 4,820,928 | Ooyama et al. |
| 4,661,702 | Welkie |
| 4,649,316 | Cleaver et al. |
| 4,503,329 | Yamaguchi et al. |
| 4,439,685 | Plies |

Beam blanking apparatus is also disclosed in the following Japanese patent publications:
1-176,082
64-089,254
62-229,645
62-177,849
62-103,950
60-089,051
60-074,249
59-116,600

In particular, the Ooyama et al. patent discloses particle beam lithography apparatus in which the beam scans a target region of the sample to draw a pattern. The apparatus selectively blanks the beam to ensure that the beam impinges upon the sample only within the selected target region.

The Welkie patent discloses a SIMS apparatus having ion beam blanking. An ion gun scans an area of the workpiece surface to sputter etch a crater. After the crater is formed, a beam blanking element limits the ion beam to etch a second, smaller crater at the bottom of the first crater, so that the ion beam does not hit the side wall of the first crater. This reduces errors introduced into the SIMS measurement from material from the side wall of the first crater.

The Cleaver et al. patent discloses an ion beam blanker system having four magnets arranged on an optical axis. Between the two center magnets is a blanking plate having an off-axis aperture. When the magnets are energized, the ion beam is deflected by an amount depending upon the charge/mass ratio of the ion species in the beam. By deflecting the beam such that the focal point is displaced away from the aperture, the ion beam is blanked off.

The Yamaguchi et al. patent discloses a scanning ion beam apparatus having a controlled beam blanking electrode for limiting the region of the workpiece subject to sputtering by the ion beam.

Plies discloses a beam blanking system having a three electrode Einzel filter lens employed as a blanking lens. The center electrode, which is at high voltage, has a blanking signal applied to it via a capacitor. The blanking lens is inserted in the beam path such that its object side nodal point coincides with the virtual source image. The beam is blocked by utilizing a sufficiently negative auxiliary voltage at the center electrode, and a pinhole diaphragm positioned downstream from the blanking lens.

Japanese Patent No. 62-229,645 discloses focused ion beam apparatus for ion implantation. The apparatus includes two-stage blanking plates having the same gain, arranged between two lenses.

Japanese Patent No. 60-089,051 discloses an ion beam device having beam blanking electrodes disposed symmetrically within a Wien filter along the axis of propagation.

Japanese Patent No. 60-074,249 discloses an ion beam device having filters arranged along the beam axis in two stages, with a beam blanking electrode disposed between filters.

Japanese Patents 1-176,082, 64-089,254, 62-177,849, 62-103,950, and 59-116,600 also disclose beam blanking devices.

Additionally, a publication by G. Ryding of Eaton Corporation discusses dose control for ion implantation apparatus, and discloses Faraday designs incorporating electrostatic or magnetic suppression of secondary particles.

Conventional beam blanking designs, however, suffer from a number of deficiencies that reduce their utility. One such limitation is ion beam instability due to hydrocarbon cracking, hydrocarbon buildup, and consequent accumulation of charge on beam blanking deflection plates. This instability reduces the ability to maintain precise control of ion beam position.

Beam blanking systems typical of the prior art also lack provision for simple, rapid and accurate measurement of ion beam current.

It is accordingly an object of the invention to provide improved beam blanking methods and apparatus.

Another object of the invention is to provide beam blanking methods and apparatus that facilitate precise control of ion beam position.

It is a further object of the invention to provide beam blanking methods and apparatus that enable accurate measurement of ion beam current.

Other general and specific objects of the invention will in part be obvious and will in part appear hereinafter.

SUMMARY OF THE INVENTION

The foregoing objects are attained by the invention, which provides methods and apparatus for blanking an ion beam directed at a workpiece.

In one aspect of the invention, a set of metallic plates having selected electrical potentials are disposed along the path of the beam. This configuration establishes a potential barrier to prevent secondary electrons generated by ions striking the blanking aperture plate from reaching the deflecting electrodes and other ion column elements. The potential well also prevents secondary ions, generated by collisions at the workpiece, from travelling upstream and striking ion column components.

In accord with one aspect of the invention, elements of the beam blanking apparatus form an electrostatic Faraday configuration. This arrangement enables measurement of beam current without requiring the introduction of components into the path of the beam.

The invention will next be described in connection with certain illustrated embodiments; however, it should be clear to those skilled in the art that various modifications, additions and subtractions can be made without departing from the spirit or scope of the claims.

BRIEF DESCRIPTION OF THE DRAWINGS

For a fuller understanding of the nature and objects of the invention, reference should be made to the following detailed description and the accompanying drawings, in which.

DESCRIPTION OF ILLUSTRATED EMBODIMENTS

Figure 1:
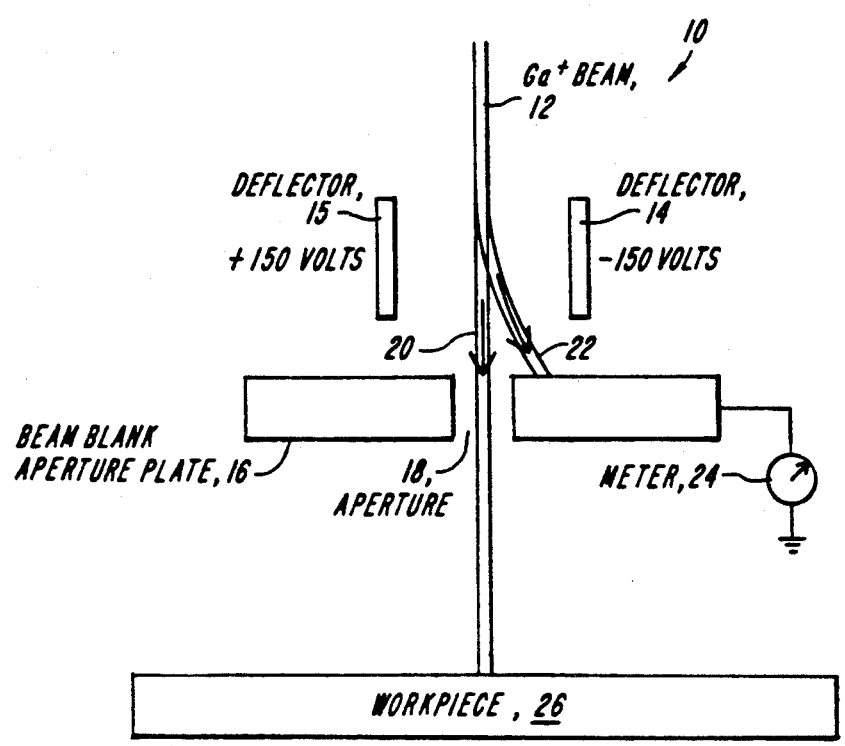
FIG. 1 is a schematic diagram depicting conventional beam blanking apparatus utilized in conjunction with a high energy gallium ion beam.

FIG. 1 is a schematic diagram depicting a conventional ion beam system 10 for processing a workpiece 26. The conventional system 10 includes elements for generating an ion beam 12 comprising Ga+ or other ions at high energy (typically on the order of 20 KeV); blanking deflection plates 14 and 15 having negative and positive potentials, respectively, for deflecting the beam 12; a metallic beam blanking aperture plate 16 having a small aperture 18 through which beam 12 normally passes to strike workpiece 26; and a current meter 24 for measuring a quantity related to ion beam current. The un-deflected path of the beam is indicated by reference numeral 20, while the deflected, blanked beam path is indicated by reference numeral 22.

As depicted in FIG. 1, when the ion beam is intended to strike the workpiece 26, the beam passes through the aperture 18 in beam blanking aperture plate 16. When beam blanking is desired, it is attained by deflecting the beam 12 to one side of the aperture 18 in the beam blanking aperture plate 16, such that the deflected beam 22 strikes the aperture plate 16 and does not reach the workpiece 26.

In a conventional ion beam apparatus, deflection of the ion beam 12 can be accomplished by applying a magnetic field along the path of the beam. However, for simplicity, and because of the relatively slow response of magnetic field generating elements, beam blanking deflection is typically provided by utilizing a set of negative- and positive-potential electrostatic deflector plates, such as electrodes 14 and 15 indicated in FIG. 1. The deflection electrodes 14, 15 are typically parallel metallic plates. Those skilled in the art will appreciate that the electrodes can have other geometries, such as sectors of a circle.

Many commercial or industrial applications of ion beam apparatus require simple, rapid measurement of beam current. In the conventional configuration depicted in FIG. 1, an indication of ion beam current can be obtained by interposing a current meter 24 between electrical ground and the beam blank aperture plate 16 to measure the apparent flow of ions to the aperture plate during blanking. This quantity is indicated in FIG. 1 by the variable I (measured). Accordingly, the beam blanking configuration depicted in FIG. 1 theoretically enables measurement of ion beam current.

Figure 2:
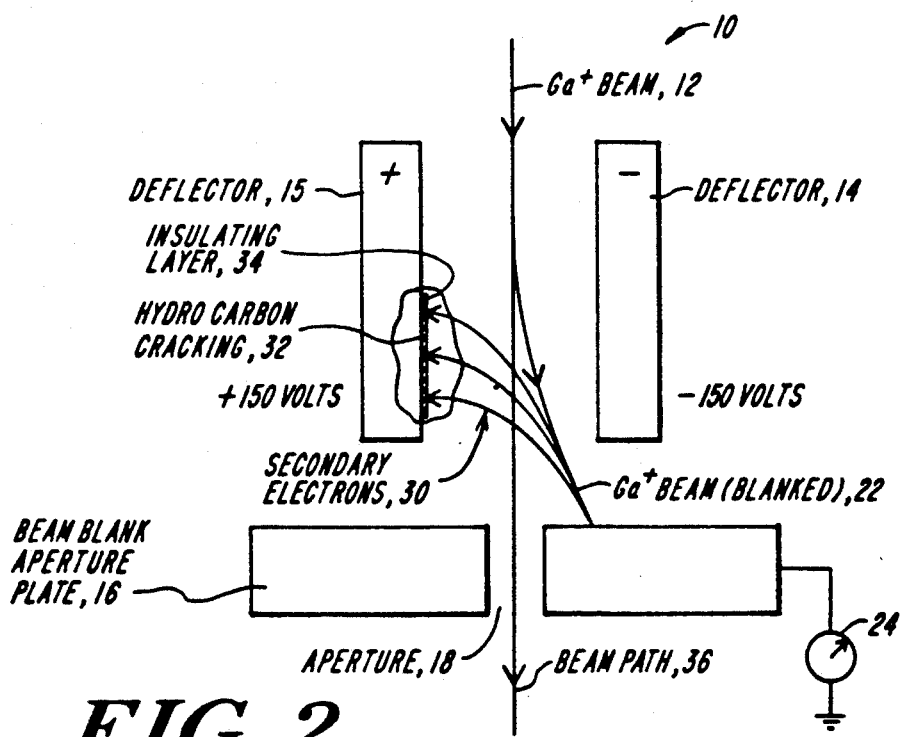
FIG. 2 is a schematic diagram depicting the problems of hydrocarbon cracking, charge buildup, and undesired beam deflection associated with the conventional beam blanking apparatus of FIG. 1.

Unfortunately, the conventional beam blanking device shown in FIG. 1 suffers from a number of deficiencies that limit its utility. As indicated in FIG. 2, a significant problem arises during blanking, when the deflected ion beam 22 strikes the blanking aperture plate 16. Specifically, the impingement of the deflected ion beam 22 upon the metallic surface of the aperture plate 16 produces low energy electrons 30. Because the deflected ion beam strikes the surface when the blanking deflectors 14 and 15 are energized with high potentials of opposite voltage polarity, the secondary electrons 30 are drawn away from the region at which they are generated, and immediately accelerate toward the positive potential electrode 15, which typically has a potential of approximately +150 volts.

When these secondary electrons 30 strike the positive deflector electrode 15, they crack hydrocarbon molecules present on the surface of the electrode 15, gradually forming a region 32 having an insulating layer 34 of cracked hydrocarbon material. This insulating layer 34 is highly susceptible to charging from the same source of electrons and thus can develop a significant and unknown potential on the surface of the electrode 15.

This unknown potential on electrode 15 causes deflection of the ion beam even when no potential is applied to the deflection electrodes—i.e., when the beam is directed at the workpiece 26. As a result, the exact position of the ion beam when impinging on the workpiece 26 is substantially uncontrolled and unknown. The position of the ion beam under these circumstances is dependent upon the potential developed at the region of hydrocarbon deposit 32. This voltage can be time dependent, and can vary during operation of the ion beam column.

The ion-induced migration of secondary electrons from the blanking plate to the positive deflecting electrode 15 creates another problem associated with conventional blanking systems, by introducing error into the current measurement technique described above. This error arises because an electron leaving the blanking aperture plate 16 gives the same apparent result as an additional positive ion impinging on the blanking aperture plate 16. Hence, with reference to FIG. 2, if a secondary electron current equal to I (electron) leaves the blanking plate due to an impinging ion beam current of I (ion beam), the measured current I (measured) is given by $$I\ (measured) = I\ (ion\ beam) + I\ (electron)$$

Accordingly, I (measured) gives an erroneous measure that is in excess of the actual ion beam current. For example, given an ion beam current of 300 picoamperes, the measured beam blank aperture current will typically be in the range of 500 picoamperes. This error can be as large as 100% in a single lens ion beam column.

Figure 3:
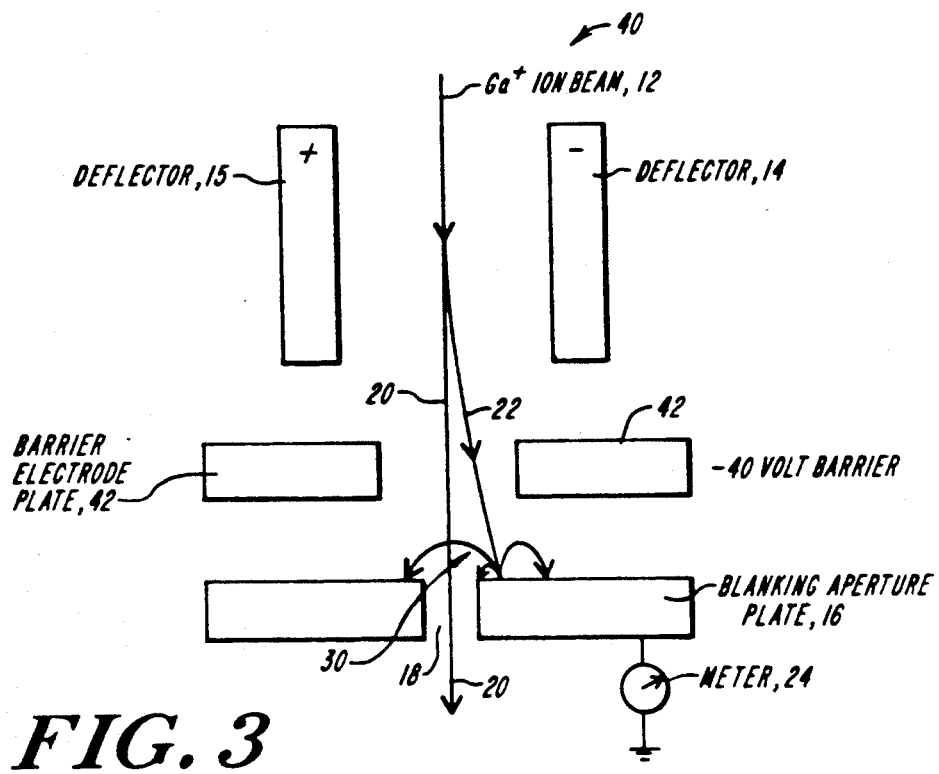
FIG. 3 is a schematic diagram depicting one embodiment of beam blanking apparatus constructed in accordance with the invention.

These problems are avoided in the invention by preventing low energy secondary electrons from striking the positive deflection electrode 15. As depicted in FIG. 3, an ion beam column 40 in accord with the invention includes a potential barrier electrode plate 42 that is energized to a selected negative potential by conventional voltage sources to establish a potential barrier to prevent secondary electrons 30 from reaching the positive deflection electrode 15. A typical value for the negative potential of electrode plate 42 is approximately −40 volts.

As FIG. 3 indicates, secondary electrons 30 are still generated by ions striking the blanking aperture plate 16 when the ion beam is blanked. However, the potential barrier established by barrier electrode plate 42 prevents these secondary electrons 30 from reaching the positive deflection electrode 15. The secondary electrons 30 cannot pass this barrier because the barrier potential exceeds the relatively small kinetic energy—several electron volts—of the secondary electrons. Thus, hydrocarbon cracking and insulator buildup on the deflector electrode 15 are sharply reduced by the arrangement depicted in FIG. 3. Additionally, the low energy of the secondary electrons 30 prevents significant hydrocarbon cracking on the aperture plate 16.

Those skilled in the art will appreciate that this reduction in hydrocarbon cracking and insulator accumulation on the deflector electrodes reduces charge accumulation and thereby increases beam stability during unblanked operation.

The configuration depicted in FIG. 3 also provides significant benefits in measurement of ion beam current. Specifically, the potential barrier established by barrier electrode plate 42 causes the secondary electrons 30 to return to the blanking aperture plate 16, so that the otherwise "missing" current component associated with migration of electrons from the aperture plate is re-integrated into the blanking aperture current. In this embodiment of the invention, the measured and actual ion beam currents are substantially equal, because few electrons 30 can leave the blanking aperture plate 16 without returning to the aperture plate. Thus, the discrepancy between actual beam current and that measured by the beam blanking aperture plate 16 is largely eliminated.

The invention accordingly provides advantages over conventional ion beam blanking configurations by affording improved ion beam stability and more accurate measurement of ion beam current.

Figure 4:
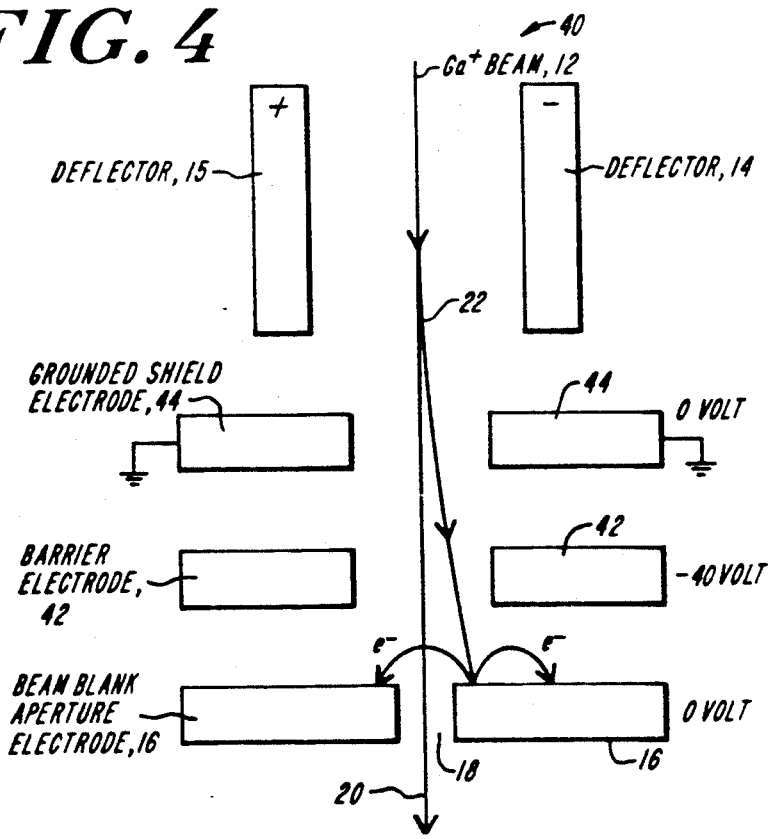
FIG. 4 is a another embodiment of the invention, utilizing a grounded shield electrode to eliminate astigmatic aberration.

Another embodiment of the invention is depicted in FIG. 4. This embodiment utilizes a grounded shield electrode 44 that eliminates astigmatic aberration of the ion beam during unblanked operation. The grounded shield element 44, which can take the form of a metallic disk or plate with a central aperture, ensures that the combination of zero voltage on the deflector plates (14, 15) and the −40V potential on the barrier electrode 42 does not cause an astigmatic aberration in the ion beam path, as would occur in the absence of the grounded shield 44.

Figure 5:
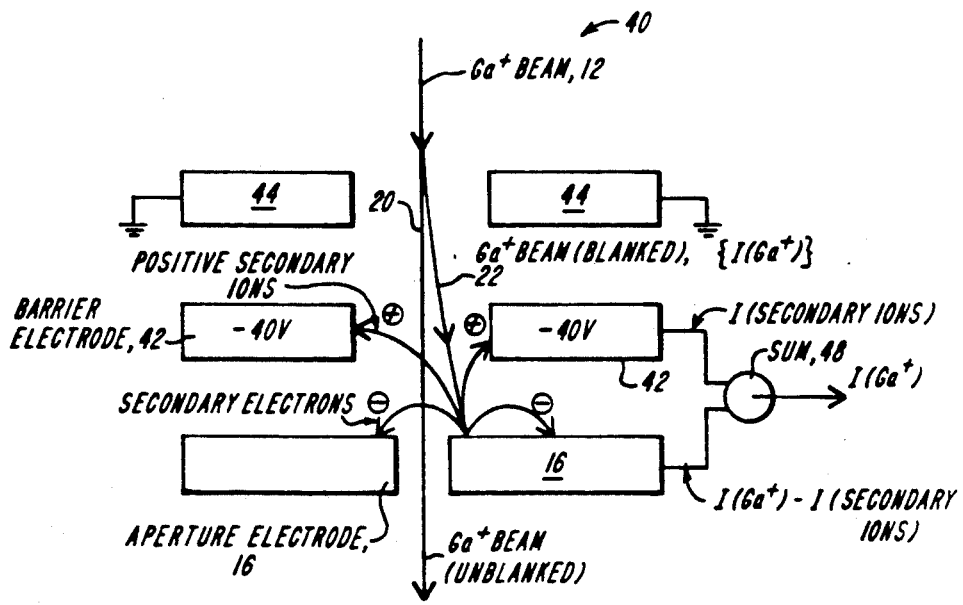
FIG. 5 is a schematic diagram depicting a further embodiment of the invention, including elements for summing current components measured at different blanking elements of the structure depicted in FIG. 4, to obtain an accurate measure of beam current.

FIG. 5 is a schematic diagram depicting a further embodiment of the invention that attains more accurate measurement of ion beam current, by summing the current components measured at the barrier electrode 42 and the aperture electrode 16. This embodiment is based upon recognition of the desorption of low energy ions from the blanking aperture plate 16 when the primary Ga+ ion beam strikes the aperture plate with an energy of approximately 20KeV. Although the ion desorption yield is approximately one order of magnitude less than the secondary electron yield, it is nonetheless significant in attaining highly accurate measurement and control of beam current.

As indicated in FIG. 5, with the barrier electrode 42 in operation, the current measured at the blanking aperture 16 is given by the following expression:

$$I\ (blanking\ aperture) = I\ (Ga+) - I\ (secondary\ ions)$$

where $I\ (Ga+)$ is the impinging gallium ion beam current and $I\ (secondary\ ions)$ is the low energy ion desorption current.

Because the barrier electrode is at a negative potential, typically −40V, a large portion of the secondary ion current actually impinges on this electrode, and thus the current to this electrode is substantially equal to the current of secondary ions that left the aperture plate 16.

Thus, to obtain a more accurate measure of the primary beam current, the current from the beam blank aperture 16 is added to the current from the barrier electrode 42 as indicated in FIG. 5. Thus, the measured current is given by the following expression:

$$I\ (measured) = [I\ (Ga+) - I\ (secondary\ ions)] + [I\ (secondary\ ions)]$$

The first bracketed term in this equation is measured at the aperture plate 16. The second term is measured at the barrier electrode 42.

Accordingly, $I\ (measured)$ is approximately equal to the primary ion beam current. Experiments with various ion beam columns indicate that the error associated with this measuring technique is less than 10%. This is more than ten times smaller than the errors experienced without the beam blank insert in place.

Figure 6:
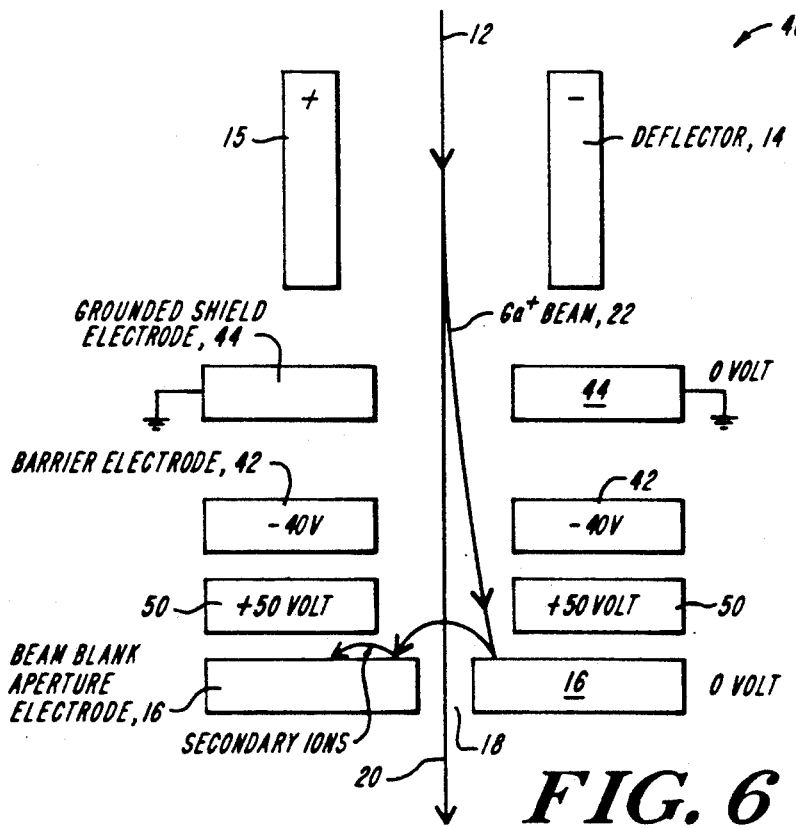
FIG. 6 depicts a further embodiment of the invention, utilizing another pair of electrodes to block tertiary electrons.

FIG. 6 depicts a further embodiment of the invention, utilizing another pair of electrodes to block tertiary electrons. In particular, a pair of electrodes 50, similar in configuration to barrier electrodes 42, are maintained at +50 volts, as indicated in FIG. 6. These additional electrodes 50 create a positive potential barrier. The potential barrier established by the positive electrodes 50 substantially prevents secondary ions from propagating further. Moreover, tertiary electrons which may be formed by secondary ions striking the barrier electrode 42 are collected on positive electrodes 50. This collection of tertiary electrons is depicted in FIG. 7.

Figure 7:
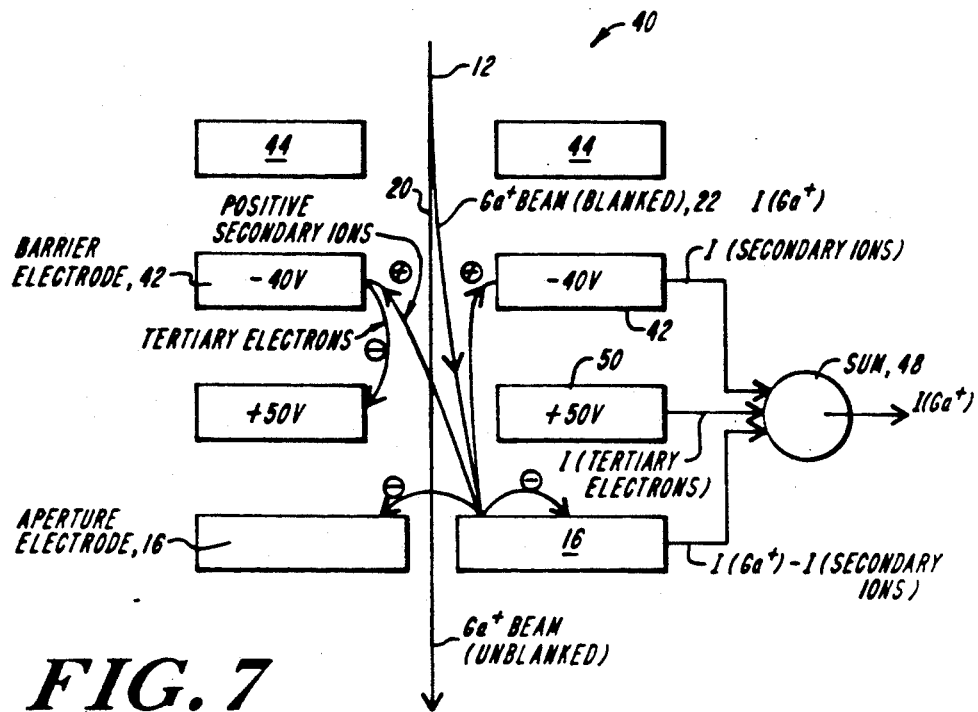
FIG. 7 depicts elements for summing current components measured at different blanking elements of the structure depicted in FIG. 6.

More particularly, FIG. 7 indicates that summing element 48 is utilized to add the current components measured at the different electrode elements depicted in FIG. 6. In particular, the measured ion beam current is given by the following expression:

$$I\ (measured) = [I\ (Ga+) - I\ (secondary\ ions)] + [I\ (secondary\ ions)] + [I\ (tertiary\ electrons)]$$

The first bracketed term in this equation is measured at the aperture plate 16. The second term is measured at the barrier electrode 42. The third term is measured at the electrodes 50. The respective measurement signals are collected at the summing element 48, as indicated in FIG. 7, and added to derive the quantity I (measured).

The configuration shown in FIG. 7 provides a further improvement in current-measuring accuracy over the embodiment depicted in FIG. 5, at the expense of additional complexity. Those skilled in the art will appreciate that still higher levels of measurement accuracy can be attained by adding more electrode stages to block and measure successive levels of collision-induced charged particles.

Figure 8:
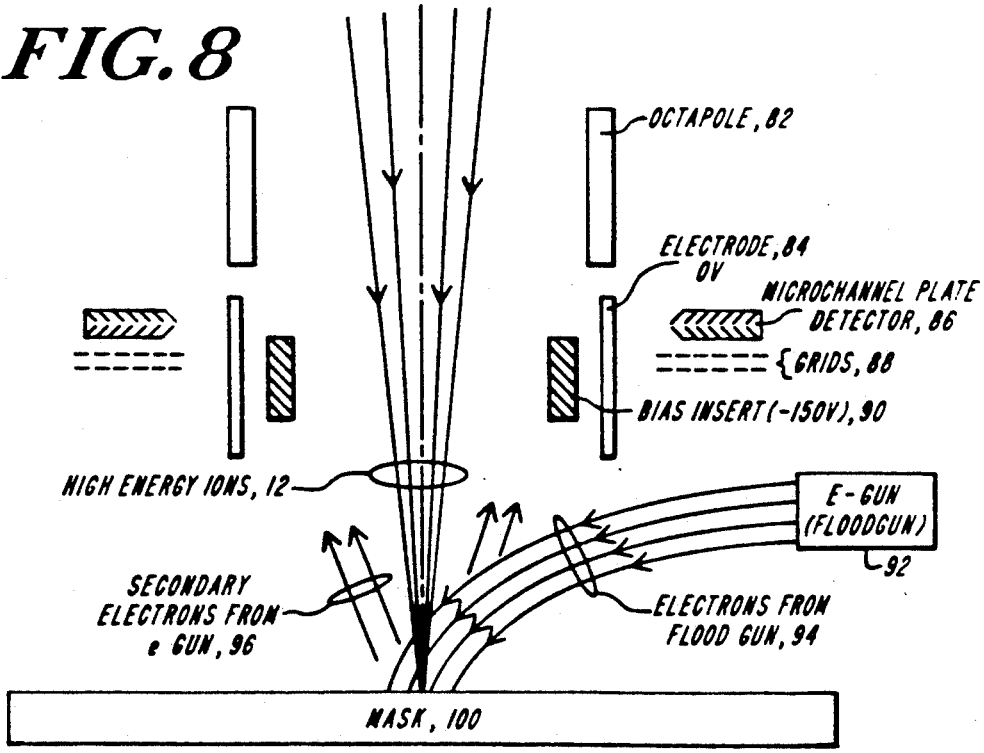
FIG. 8 depicts another embodiment of the invention, utilizing a bias tube element to establish a negative potential barrier.

FIG. 8 depicts another ion beam system utilizing a further embodiment of the invention. The ion beam column of ion beam system 80 includes an octopole element 82 for deflecting and focusing a beam of high energy ions 12 and directing the ions at a mask or other target 100. The system also includes conventional microchannel plate detectors 86; grids 88; and an electron flood gun 92 for charge neutralization. In particular, flood gun 92 directs electrons 94 at the mask 100 to neutralize the accumulation of positive charge caused by the ion beam 12. The impact of the electrons 94 generated by the electron flood gun 92 generates secondary electrons 96 which, if permitted to strike the octopole element 82, would create insulating layers and cause charge accumulation on such insulating layers.

In order to avoid the problems caused by secondary electrons 96, the system 80 incorporates electrodes 84 and a bias tube element 90 which form a potential barrier to prevent the secondary electrons 96 from propagating upstream and striking the octopole element 82. As indicated in FIG. 8, the bias element 90 can be a tubular metallic element, maintained at a potential of approximately −150 Volts, while electrodes 84 are grounded to maintain a zero volt potential.

The bias element 90 thereby establishes a negative potential barrier that prevents secondary electrons generated by the action of the flood gun 92 from striking any of the deflecting or focusing elements in the octopole 82.

It will thus be seen that the invention efficiently attains the objects set forth above, among those made apparent from the preceding description. In particular, the invention provides improved beam blanking methods and apparatus enabling enhanced control of ion beam position and accurate measurement of beam current.

It will be understood that changes may be made in the above construction and in the foregoing sequences of operation without departing from the scope of the invention. It is accordingly intended that all matter contained in the above description or shown in the accompanying drawings be interpreted as illustrative rather than in a limiting sense.

It is also to be understood that the following claims are intended to cover all of the generic and specific features of the invention as described herein, and all statements of the scope of the invention which, as a matter of language, might be said to fall therebetween.

Having described the invention, what is claimed as new and secured by Letters Patent is:

1. In an ion beam apparatus including
(A) a beam generating means for generating a focused beam of ions to propagate substantially toward a workpiece during unblanked periods of operation and
(B) a beam blanking means for blanking the beam during selected blanked periods of operation, wherein the beam blanking means includes (i) an aperture means, including an aperture element, for providing an aperture through which the beam passes to propagate to the workpiece during unblanked periods of operation, and (ii) a beam deflecting means for deflecting the beam during the blanked periods so that the beam is deflected away from the aperture and strikes the aperture element, whereby the beam is prevented from propagating to the workpiece, the improvement comprising
potential barrier means for generating an electric potential barrier in a region between the aperture means and the beam deflecting means, said potential barrier having a selected potential exceeding the kinetic energy of secondary charged particles emitted from the aperture element due to ions striking the aperture element during the blanked periods, the region being located such that
(i) secondary charged particles emitted form the aperture element during the blanked periods are prevented from striking the beam deflecting means,
thereby reducing any of hydrocarbon cracking, insulator accumulation, and charge accumulation on said deflecting means due to impacts of the secondary charged particles on the beam deflecting means, and enhancing ion beam positional accuracy during unblanked periods of operation, and
(ii) the charged particles emitted from the aperture element are returned to the aperture element.

2. In apparatus according to claim 1, the further improvement wherein said potential barrier means comprises
at least one barrier electrode having a selected negative potential applied thereto,
so that electrons emitted from the aperture element are prevented from striking the beam deflecting means and are returned to the aperture element.

3. In apparatus according to claim 2, the further improvement wherein said at least one barrier electrode has a potential of approximately −24 volts applied thereto.

4. In apparatus according to claim 2, the further improvement comprising
current measuring means, electrically coupled to the aperture element, for measuring the current of ions flowing to the aperture element during blanking, said current of ions flowing to the aperture element providing a measure of ion beam current.

5. In apparatus according to claim 2, the further improvement wherein said potential barrier means further comprises
at least one shield electrode disposed between said at least one barrier electrode and the beam deflecting means,
said at least one shield electrode being electrically coupled to electrical ground, so that astigmatic aberration of the ion beam, due to the negative potential applied to said at least one barrier electrode, is substantially eliminated during unblanked periods of operation.

6. Ion beam apparatus according to claim 1, further comprising beam current sensing means for sensing a beam current corrected for emission of secondary particles.

7. Ion beam apparatus according to claim 1, further comprising beam current sensing means for sensing a beam current corrected for emission of secondary and tertiary particles.

8. In an ion beam apparatus including (A) a beam generating means for generating a beam of ions to propagate substantially toward a workpiece during unblanked periods of operation and (B) a beam blanking means for blanking the beam during selected blanked periods of operation, wherein the beam blanking means includes (i) an aperture means, including an aperture element, for providing an aperture through which the beam passes to propagate to the workpiece during unblanked periods of operation, and (ii) a beam deflecting means for deflecting the beam during the blanked periods so that the beam is deflected away form the aperture and strikes the aperture element, whereby the beam is prevented from propagating to the workpiece, the improvement comprising potential barrier means for generating an electric potential barrier between the aperture means and the beam deflecting means, said potential barrier including at least one barrier electrode having a selected negative potential applied thereto, exceeding the kinetic energy of secondary charged particles emitted form the aperture element due to ions striking the aperture element during the blanked periods, so that (i) secondary charged particles emitted from the aperture element during the blanked periods are prevented from striking the beam deflecting means, thereby reducing any of hydrocarbon cracking, insulator accumulation, and charge accumulation on said deflecting means due to impacts of the secondary charged particles on the beam deflecting means, and enhancing ion beam positional accuracy during unblanked periods of operation, and (ii) the charged particles emitted from the aperture element are returned to the aperture element, and also comprising first current measuring means, electrically coupled to the aperture element, for generating a first electrical signal representative of the current of ions flowing to the aperture element during blanking, minus the current of secondary ions desorbed from said aperture element, second current measuring means, electrically coupled to said at least one barrier electrode, for generating a second electrical signal representative of the current of secondary ions desorbed from said aperture element and striking said at least one barrier electrode, and summing means, electrically connected to said first current measuring means and said second current measuring means, for generating an electrical signal representative of the sum of said first and second electrical signals, said sum being representative of ion beam current.

9. In an ion beam apparatus according to claim 8, the further improvement wherein said potential barrier means further comprises at least one shield electrode disposed between said at least one barrier electrode and the beam deflecting means, said at least one shield electrode being electrically coupled to electrical ground, so that astigmatic aberration of the ion beam, due to the negative potential applied to said at least one barrier electrode, is substantially eliminated during unblanked periods of operation.

* * * * *